(12) United States Patent
Shimizu et al.

(10) Patent No.: US 9,380,707 B2
(45) Date of Patent: Jun. 28, 2016

(54) METHOD OF MANUFACTURING WIRING SUBSTRATE

(71) Applicant: SHINKO ELECTRIC INDUSTRIES CO., LTD., Nagano-ken (JP)

(72) Inventors: Noriyoshi Shimizu, Nagano (JP); Akio Rokugawa, Nagano (JP); Toshinori Koyama, Nagano (JP); Wataru Kaneda, Nagano (JP)

(73) Assignee: Shinko Electric Industries Co., Ltd., Nagano-shi, Nagano-ken ( * ) Notice: Subject to any disclaimer, the term of this patent is extended or adjusted under 35 U.S.C. 154(b) by 309 days.

(21) Appl. No.: 14/090,076

(22) Filed: Nov. 26, 2013

(65) Prior Publication Data

US 2014/0150258 A1    Jun. 5, 2014

(30) Foreign Application Priority Data

Dec. 4, 2012    (JP) .................................. 2012265471

(51) Int. Cl.

| | |
|---|---|
| H05K 3/02 | (2006.01) |
| H01L 23/48 | (2006.01) |
| H05K 3/00 | (2006.01) |
| H05K 3/20 | (2006.01) |
| H01L 23/498 | (2006.01) |
| H01L 21/48 | (2006.01) |
| H05K 3/46 | (2006.01) |

(52) U.S. Cl.
CPC .............. *H05K 3/007* (2013.01); *H01L 21/486* (2013.01); *H01L 21/4857* (2013.01); *H01L 23/49822* (2013.01); *H01L 23/49827* (2013.01); *H05K 3/20* (2013.01); *H05K 3/4644* (2013.01); *H01L 23/49816* (2013.01); *H01L 2224/16225* (2013.01); *H01L 2924/00* (2013.01); *H01L 2924/12044* (2013.01);

(Continued)

(58) Field of Classification Search
CPC ..... H05K 3/007; H05K 3/205; H05K 3/4644; H05K 3/4682; H05K 2201/09527; H05K 3/20; H05K 3/4602; H01L 21/4857; H01L 21/486; H01L 23/49816; H01L 23/49822; H01L 23/49827; H01L 2924/00; H01L 2924/12044; H01L 2924/15311; H01L 2224/16225; Y10T 29/49126; Y10T 29/49128; Y10T 29/49155; Y10T 29/49165

See application file for complete search history.

(56) References Cited

U.S. PATENT DOCUMENTS

| | | | | |
|---|---|---|---|---|
| 4,830,691 | A | * 5/1989 | Kida | .................... H05K 3/4602 156/150 |
| 7,584,535 | B2 | 9/2009 | Tsukamoto et al. | |

(Continued)

FOREIGN PATENT DOCUMENTS

| | | |
|---|---|---|
| JP | 2002-190543 | 7/2002 |
| JP | 2004-342988 | 12/2004 |

(Continued)

*Primary Examiner* — A. Dexter Tugbang
(74) *Attorney, Agent, or Firm* — Fish & Richardson P.C.

(57) ABSTRACT

A method of manufacturing a wiring substrate includes: preparing a laminated plate of a metal layer and an insulating layer; adhering the laminated plate to a first support body facing the metal layer; and forming a first wiring layer with vias extending through the insulating layer and first pads exposed from a first surface of the insulating layer. The method also includes: separating a multilayer structure including the metal, insulating, and first wiring layer from the first support body; adhering the multilayer structure to a second support body facing the first wiring layer; removing the metal layer; forming a plurality of second wiring layers including second pads connected to the vias and exposed from a second surface of the insulating layer opposite the first surface; and separating the insulating, the first wiring, and the plurality of second wiring layers from the second support body, to obtain the wiring substrate.

9 Claims, 7 Drawing Sheets

(52) U.S. Cl.
CPC ...... *H01L 2924/15311* (2013.01); *H05K 3/205* (2013.01); *H05K 3/4602* (2013.01); *H05K 3/4682* (2013.01); *H05K 2201/09527* (2013.01); *Y10T 29/49126* (2015.01); *Y10T 29/49128* (2015.01); *Y10T 29/49155* (2015.01); *Y10T 29/49165* (2015.01)

(56) References Cited

U.S. PATENT DOCUMENTS

| | | | |
|---|---|---|---|
| 2001/0005545 A1* | 6/2001 | Andou | H05K 3/20 428/209 |
| 2004/0178492 A1 | 9/2004 | Tsukamoto et al. | |
| 2007/0175025 A1 | 8/2007 | Tsukamoto et al. | |
| 2008/0115355 A1* | 5/2008 | Park | H05K 3/205 29/852 |
| 2009/0173531 A1* | 7/2009 | Kim | H05K 3/007 174/262 |
| 2011/0155429 A1* | 6/2011 | Lee | H05K 3/007 174/257 |

FOREIGN PATENT DOCUMENTS

| | | |
|---|---|---|
| JP | 2007036095 A * | 2/2007 |
| WO | WO 03/030602 | 4/2003 |

* cited by examiner

METHOD OF MANUFACTURING WIRING SUBSTRATE

CROSS-REFERENCE TO RELATED APPLICATIONS

This application is based upon and claims the benefit of priority from prior Japanese Patent Application No. 2012-265471, filed on Dec. 4, 2012, the entire contents of which are incorporated herein by reference.

FIELD

The present disclosure relates to a method of manufacturing a wiring substrate.

BACKGROUND

A semiconductor package includes a semiconductor element, a package substrate, and a wiring substrate (interposer), which electrically connects the semiconductor element and the package substrate (e.g., Japanese Laid-Open Patent Publication No. 2002-190543, Japanese Laid-Open Patent Publication No. 2004-342988, WO 2003/030602). The interposer has one surface (e.g., upper surface) including bumps that are connected to the semiconductor element and another surface (e.g., lower surface) including bumps that are connected to the package substrate. The interposer includes wiring layers that electrically connect the bumps formed on the two surfaces to each other.

The pitch of connection terminals (pads) for a semiconductor element, such as a memory, has become narrow. When increasing the number of wiring layers in the interposer to cope with the narrow connection terminal pitch, the thickness of the interposer increases. This may enlarge the semiconductor package.

SUMMARY

One aspect of the present invention is a method of manufacturing a wiring substrate. The method includes preparing a laminated plate including a metal layer and an insulating layer; adhering the laminated plate to a first support body with the metal layer facing the first support body; forming a first wiring layer including a via that extends through the insulating layer and first pads exposed from a first surface of the insulating layer; separating from the first support body a multilayer structure including the metal layer, the insulating layer, and the first wiring layer; adhering the multilayer structure to a second support body with the first wiring layer facing the second support body; removing the metal layer; forming a plurality of second wiring layers including second pads that are connected to the via and exposed from a second surface of the insulating layer that is opposite to the first surface; and separating the insulating layer, the first wiring layer, and the plurality of second wiring layers from the second support body to obtain the wiring substrate.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DESCRIPTION OF EMBODIMENTS

Components in the drawings are illustrated for simplicity and clarity and have not necessarily been drawn to scale. Hatching lines may not be illustrated in the cross-sectional views to facilitate understanding.

Figure 1:
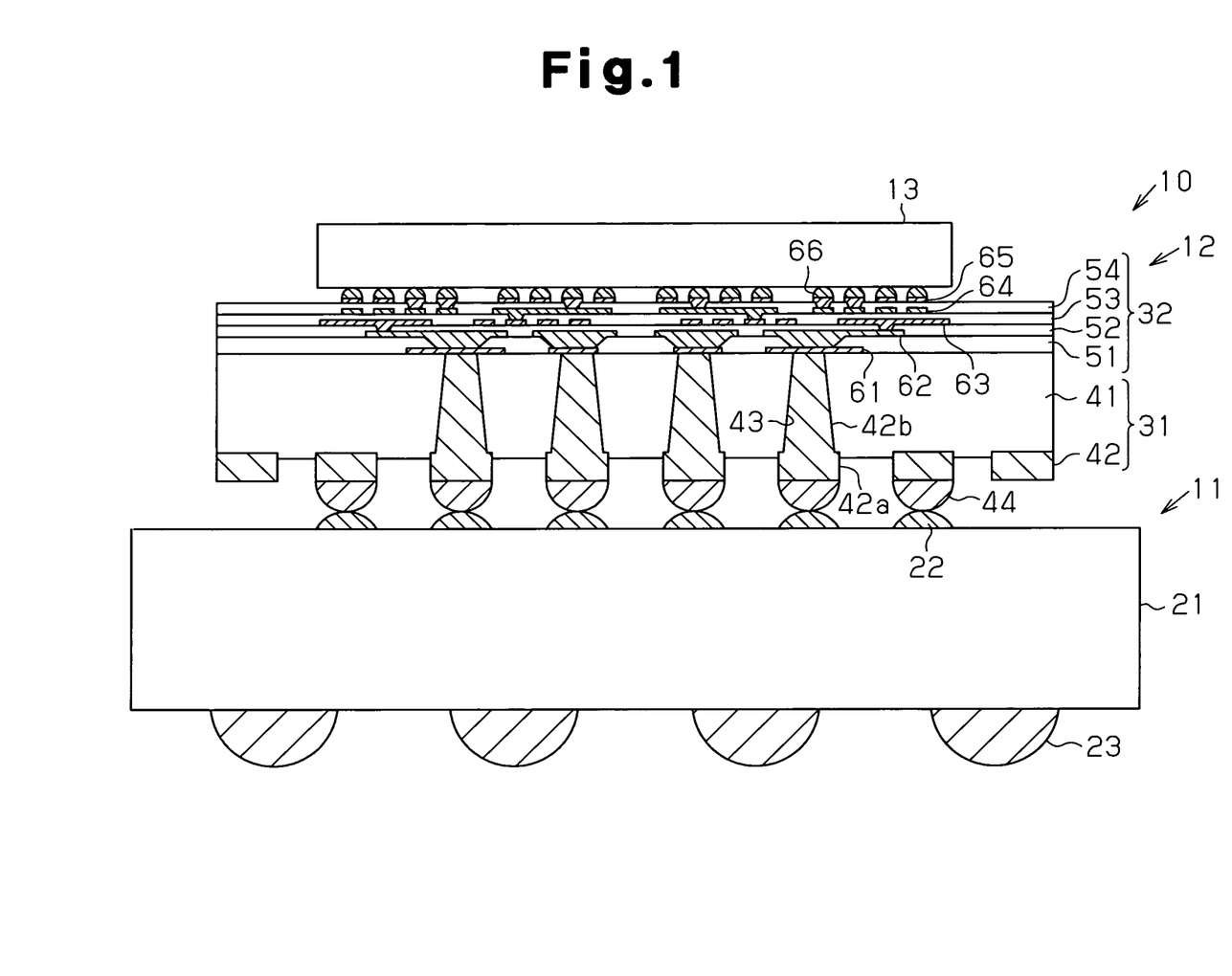
FIG. 1 is a schematic cross-sectional view illustrating one embodiment of a semiconductor package.

As illustrated in FIG. 1, a semiconductor package 10 includes a package substrate 11, an interposer 12 (intermediate substrate), and a semiconductor element 13. The interposer 12 is mounted on an upper surface of the package substrate 11, and the semiconductor element 13 is mounted on an upper surface of the interposer 12. The semiconductor element 13 is, for example, a memory.

The package substrate 11 includes a substrate body 21. Connection bumps 22 are formed on the upper surface of the substrate body 21 to allow for mounting of the interposer 12. Mounting bumps 23 are formed on the lower surface of the substrate body 21 to allow for the semiconductor package 10 to be mounted on a mounting substrate, such as a motherboard (not illustrated). The material of the bumps 22 and 23 is, for example, solder. The mounting bumps 23 are arranged in correspondence with the pads of the mounting substrate. In the illustrated example, the mounting bumps 23 are arranged in the form of, for example, a lattice, and the pitch between the mounting bumps 23 is, for example, 180 µm (micrometers).

The substrate body 21 is an organic substrate containing fibers of, for example, glass or the like. The substrate body 21 may have, for example, a tetragonal shape as viewed from above. The substrate body 21 is configured to connect the connection bumps 22 on the upper surface and the mounting bumps 23 on the lower surface. The substrate body 21 may or may not include wiring layers. When the substrate body 21 includes wiring layers, an insulating layer is formed between the wiring layers. The bumps 22 and 23 are electrically connected via the wiring layers and vias formed in the insulating layer. The substrate body 21 may be, for example, a cored build-up substrate or a coreless substrate.

The interposer 12 may be tetragonal as viewed from above like the package substrate 11. The interposer 12 includes a core portion 31 and a wiring portion 32. The core portion 31 includes a core substrate 41 and a wiring layer 42. Through holes 43 extend through the core substrate 41 in the thicknesswise direction.

The material of the core substrate 41 is, for example, an organic resin, such as polyimide, and does not contain fibers of glass or the like. The core substrate 41 is a sheet member. Preferably, the core substrate 41 has a thickness of 100 µm or less, and is, for example, 35 µm. The core substrate 41 is an example of an insulating layer. In the illustrated embodiment, the core substrate 41 is formed by an insulating layer 107, which will be described later.

The wiring layer 42 includes pads 42a, which are exposed from the lower surface of the core substrate 41, and vias 42b, which are formed in the through holes 43 of the core substrate 41. The through holes 43 of the core substrate 41 are formed by, for example, processing the core substrate 41 with a laser beam. The pads 42a and the vias 42b may be formed by plating or the like in the same manufacturing step (process). The wiring layer 42 is an example of a first wiring layer.

A connection bump 44 is formed on a surface (lower surface as viewed in FIG. 1) of the pad 42a to connect the interposer 12 and the package substrate 11. The material of the connection bump 44 may be, for example, an alloy containing lead (Pb), an alloy of tin (Sn) and Au, an alloy of Sn and Cu, an alloy of Sn and Ag, an alloy of Sn, Ag, and Cu, and the like.

The wiring portion 32 includes insulating layers 51 to 54 and wiring layers 61 to 65. The insulating layers 51 to 54 are formed from a photosensitive resin. The insulating layers 51 to 54 are formed from a photosensitive resist. The resist prior to curing may be, for example, a liquid resist or a sheet resist.

The wiring layer 61 formed on the upper surface of the core substrate 41 includes pads electrically connected to the vias 42b of the core substrate 41. The wiring layers 62 to 65 each includes a wiring pattern and vias electrically connecting the wiring pattern to the wiring pattern of another wiring layer. The vias of the wiring layers 62 to 65 extend through the insulating layers 51 to 54. The wiring layer 65 includes an outermost wiring pattern exposed from the upper surface of the wiring portion 32. The outermost wiring pattern includes mounting pads connected to pads (not illustrated) of the semiconductor element 13. The mounting pads are arranged in the form of a lattice in correspondence with the pad layout of the semiconductor element 13. The pitch between the mounting pads is, for example, 30 μm. A mounting bump 66 is formed on a surface (upper surface as viewed in FIG. 1) of each mounting pad. The material of the mounting bump 66 may be, for example, an alloy containing lead (Pb), an alloy of tin (Sn) and Au, an alloy of Sn and Cu, an alloy of Sn and Ag, and an alloy of Sn, Ag and Cu, and the like. The wiring layers 61 to 65 is an example of a second wiring layer.

A common manufacturing step (process) may be employed to form the wiring layers 62 to 65 (wiring patterns and vias). The wiring layers 61 to 65 are formed through, for example, a semi-additive method. In a preferred example, each of the wiring layers 61 to 65 includes a seed layer and a plating layer. The seed layer is, for example, a thin film formed by sputtering, and the plating layer is formed by electrolytic plating using the seed layer as an electrode. The material of each wiring layer 61 to 65 is, for example, copper (Cu). The wiring pattern of each wiring layer 61 to 65 has a thickness of, for example, one to three μm. A wiring pattern has a designed L/S (Line/Space) of, for example, 5 μm/5 μm to 1 μm/1 μm. Each via has a diameter φ of, for example, 20 μm to 10 μm.

The wiring layer 42 of the core substrate 41 and the wiring layers 61 to 65 of the wiring portion 32 cooperate to electrically connect the mounting bumps 66 on the upper surface of the interposer 12 and the connection bumps 44 on the lower surface of the interposer 12.

The operation of the semiconductor package 10 will now be described.

The interposer 12 connecting the package substrate 11 and the semiconductor element 13 includes the core substrate 41, which is an organic resin substrate, and the insulating layers 51 to 54, each of which is an organic resin layer. Accordingly, wiring layers may be formed on the two surfaces of the interposer 12. In contrast, a silicon interposer includes electrodes that extend through a silicon substrate and thus can form a wiring layer only on one surface of the silicon interposer. The present embodiment allows for the number of wiring layers of the interposer 12 to be increased. Further, the wiring layers allow for the mounting pads (wiring layer 65) of the semiconductor element 13 and the pads 42a of the package substrate 11 to be connected in the interposer 12. Thus, the mounting pads of the interposer 12 may be formed at a narrow pitch in correspondence with the narrowed connection terminal pitch of the semiconductor element 13.

The material of the core substrate 41 and the insulating layers 51 to 54 of the wiring portion 32 is, for example, an organic resin and does not contain a reinforcement material of glass cloth or the like. The interposer 12 may have a suitable degree of flexibility even after curing the resin of the core substrate 41 and the wiring portion 32. Due to such flexibility, the interposer 12 may be bent in accordance with the deformation or situation of the connected semiconductor element 13 and the package substrate 11. For example, the semiconductor element 13 may be warped due when a passivation film contracts. In such a case, the interposer 12 may be bent in correspondence with the warping of the semiconductor element 13. This allows for the bumps 66 to connect the semiconductor element 13 and the interposer 12. Further, the bending of the interposer 12 reduces the stress acting on the bumps 66. With a silicon interposer, which is a rigid substrate that does not deflect, when the semiconductor element 13 is warped, bumps may not be connected to pads. Alternatively, the stress acting on the bumps may result in connection failures in which the bumps are separated from the pads.

A method of manufacturing the interposer 12 will now be described.

Figure 2A:
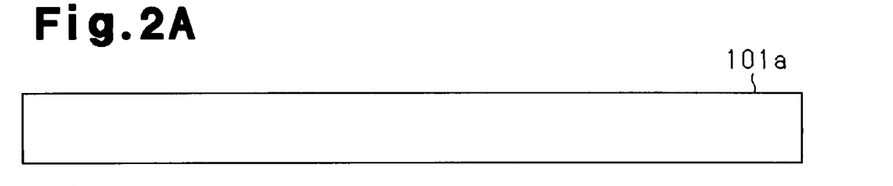
FIGS. 2A to 2E, FIGS. 3A to 3E, FIGS. 4A to 4E, FIGS. 5A to 5D, and FIGS. 6A to 6C are schematic cross-sectional views illustrating a method of manufacturing a wiring substrate.

As illustrated in FIG. 2A, a support body 101a is first prepared. The material of the support body 101a is, for example, copper (Cu). The support body 101a is, for example, a plate having a diameter of 200 mm (millimeters) and a thickness of 0.6 mm. The support body 101a may be a circular plate or a tetragonal plate. The support body 101a is an example of a first support body.

Figure 2B:
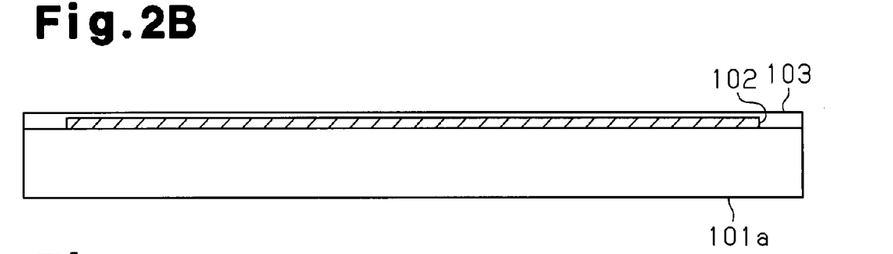
Figure 2C:
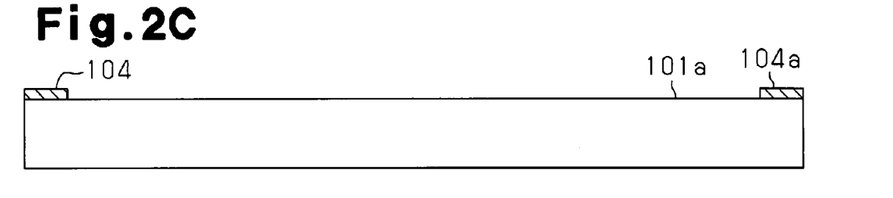

Referring to FIG. 2B, a plate material 102 having a predetermined shape (e.g., circular) is arranged in the middle of the upper surface of the support body 101a. The size of the plate material 102 is set so that an upper surface of a peripheral portion of the support body 101a is exposed from the outer side of the plate material 102. An adhesive layer 103 is formed to cover the upper surface of the plate material 102 and the upper surface of the support body 101a. In one example, the adhesive layer 103 is formed by adhering a thermosetting epoxy adhesive sheet to the upper surface of the support body 101a. Referring to FIG. 2C, the plate material 102 is removed from the support body 101a so that an annular adhesive layer 104a remains on the edge of the upper surface of the support body 101a at the outer side of the plate material 102. The adhesive layer 104a is an example of a first adhesive layer.

The adhesive layer 104a may be formed by, for example, adhering an annular sheet of adhesive on the upper surface of the support body 101a. Alternatively, the adhesive layer 104a may be formed by applying adhesive with a syringe or the like to the edge of the upper surface of the support body 101a.

Figure 2D:
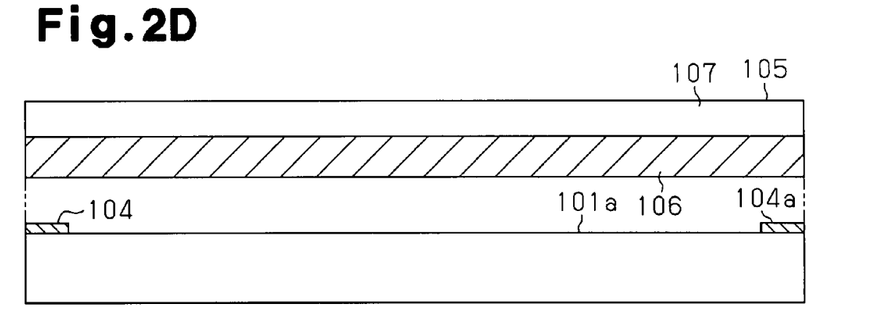

Next, as illustrated in FIG. 2D, a laminated plate 105 in which a metal layer 106 and an insulating layer 107 are laminated is prepared. The metal layer 106 is formed from, for example, copper and has a thickness of, for example, 15 μm. The insulating layer 107 is, for example, a polyimide layer. The insulating layer 107 forms the core substrate 41 illustrated in FIG. 1 after being cut, as will be described later. From FIG. 2E, reference character 41 denoting the core substrate will be used for the insulating layer 107 of FIG. 2D.

Figure 2E:
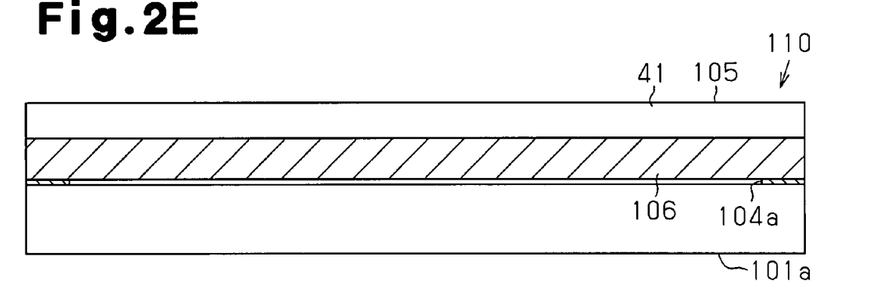

Under a situation in which the metal layer 106 of the laminated plate 105 faces the upper surface of the support body 101a including the adhesive layer 104a, the support body 101a and the laminated plate 105 are arranged in a depressurization chamber. While heating the support body 101a and the laminated plate 105 to a predetermined temperature (e.g., 190° C. to 200° C.) under a depressurized environment (e.g., in vacuum atmosphere), the support body 101a and the laminated plate 105 are pressurized in a direction (vertical direction as viewed in the drawing) that is orthogonal to a main surface of the support body 101a. This obtains a rigid structure 110 that is illustrated in FIG. 2E. In the rigid structure 110, the support body 101a and the metal layer 106 are adhered to each other.

The support body 101a and the metal layer 106 provide the rigid structure 110 with the mechanical strength necessary for the subsequent manufacturing steps. For example, the use of the rigid structure 110 allows for the insulating layer 41 to be easily conveyed in the manufacturing process and also reduces or suppresses warping of the insulating layer 41 and the thin film produced in the manufacturing process.

Figure 3A:
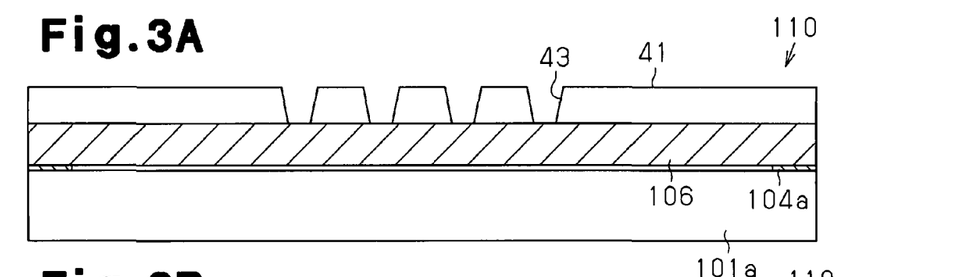

Next, as illustrated in FIG. 3A, the through holes 43 are formed at predetermined positions in the insulating layer 41 to partially expose the metal layer 106. The through holes 43 are formed by, for example, emitting a laser beam. The laser beam is, for example, ultraviolet light and generated by a UV-YAG laser or an excimer UV laser. If the through holes 43 are formed by emitting a laser beam, a desmear process is performed to remove resin smear or the like.

Figure 3B:
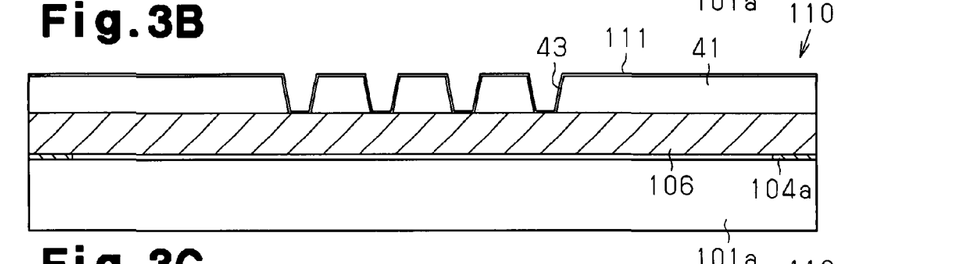

As illustrated in FIG. 3B, sputtering is performed to form a seed layer 111 on the wall surface of each through hole 43, the metal layer 106 exposed from the through holes 43, and the upper surface of the insulating layer 41. The seed layer 111 may be, for example, a multilayer including a titanium (Ti) layer and a copper (Cu) layer or a multilayer including a nickel (Ni) layer and a copper layer. For example, the titanium layer or the nickel layer is first formed. Then, the copper layer is formed.

Figure 3C:
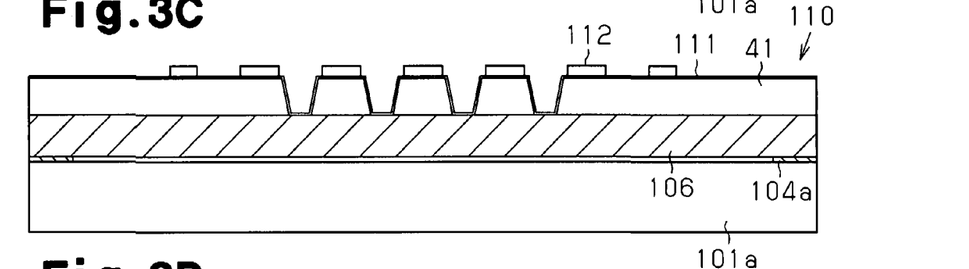

Then, as illustrated in FIG. 3C, a mask 112 is formed on the seed layer 111 at predetermined positions. The mask 112 is formed, for example, by applying a liquid resist on the upper surface of the seed layer 111, curing the liquid resist, and patterning the liquid resist.

Figure 3D:
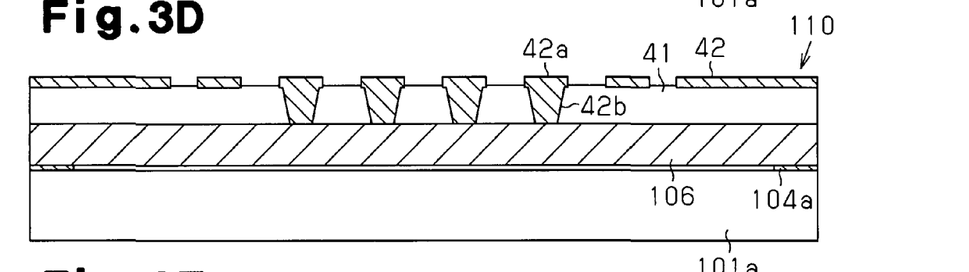

Then, electrolytic plating is performed using the seed layer 111 as an electrode to form a plating layer on the upper surface of the seed layer 111. Subsequently, the mask 112 is removed, and etching is performed to remove the exposed seed layer 111. This forms the wiring layer 42 including the pads 42a and the vias 42b, as illustrated in FIG. 3D.

Figure 3E:
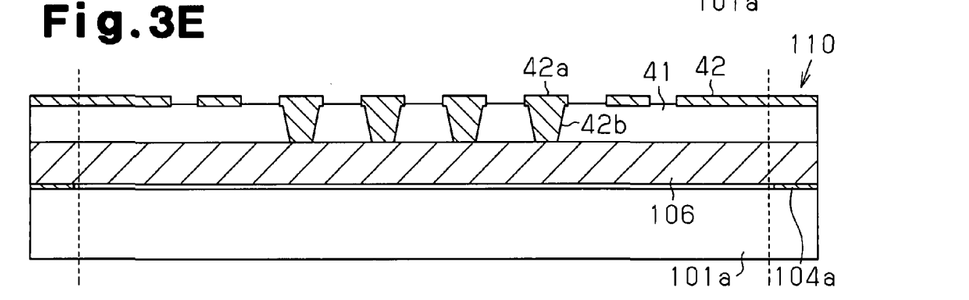
Figure 4A:
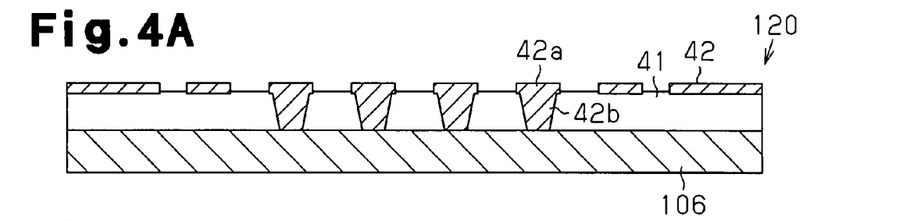

The rigid structure 110 is then cut, for example, by a router where broken lines are illustrated in FIG. 3E in correspondence with the adhesive layer 104a to separate a multilayer structure 120 illustrated in FIG. 4A from the support body 101a. The cutting position of the rigid structure 110 is set slightly toward the inner side of the inner edge of the adhesive layer 104a. The cutting position may be changed as long as the multilayer structure 120 can be separated from the support body 101a. For example, the center of a router bit may be moved along the inner edge of the adhesive layer 104a to cut the rigid structure 110.

Figure 4B:
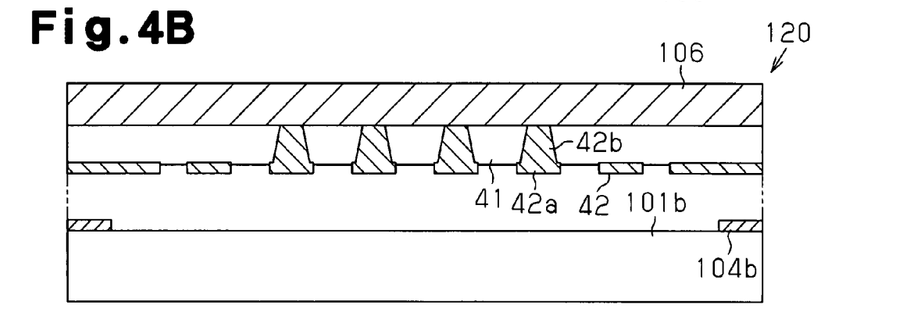

As illustrated in FIG. 4B, a support body 101b in which an adhesive layer 104b is formed at the edge of the upper surface is prepared. The adhesive layer 104b is formed in the same manner as the adhesive layer 104a. The support body 101b is an example of a second support body. The adhesive layer 104b is an example of a second adhesive layer. The multilayer structure 120 of FIG. 4A is reversed upside down so that the upper surface (adhesive layer 104b) faces the support body 101b and the first surface (wiring layer 42) of the multilayer structure 120.

Figure 4C:
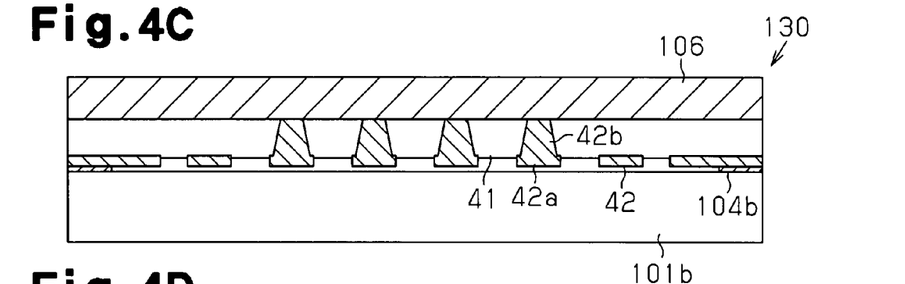

While heating the support body 101b and the multilayer structure 120 to a predetermined temperature (e.g., 190° C. to 200° C.) under a depressurized environment (e.g., vacuum atmosphere), the support body 101b and the multilayer structure 120 are pressurized in a direction (vertical direction as viewed in the drawing) orthogonal to the main surface of the support body 101b. This obtains a rigid structure 130 in which the support body 101b is adhered to the wiring layer 42, as illustrated in FIG. 4C. The support body 101b provides the rigid structure 130 with the mechanical strength necessary for the subsequent manufacturing steps. The use of the rigid structure 130 allows for the insulating layer 41, which is formed from an organic resin, to be easily conveyed in the manufacturing process and also reduces or suppresses warping of the insulating layer 41 and the thin film produced in the manufacturing process.

Figure 4D:
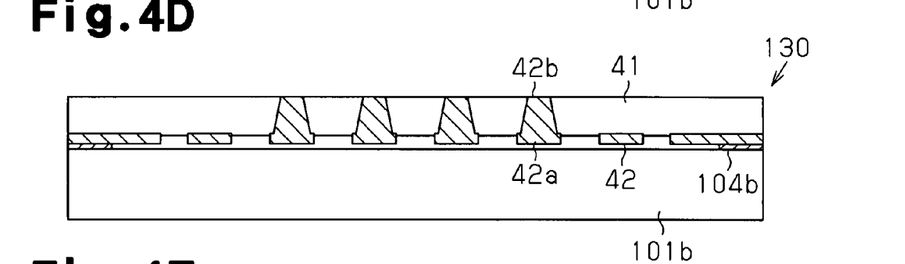

Then, as illustrated in FIG. 4D, the metal layer 106 is removed by, for example, etching. The etching of the metal layer 106 is performed using, for example, an alkali etchant.

Figure 4E:
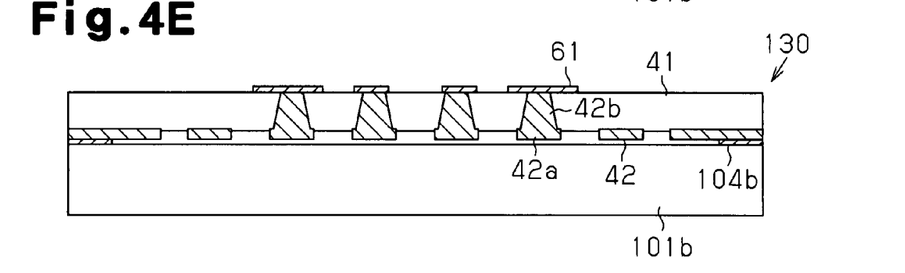

As illustrated in FIG. 4E, the wiring layer 61 connected to the vias 42b is formed on the upper surfaces of the insulating layer 41 and the vias 42b. The wiring layer 61 is formed through, for example, a semi-additive process. In one example, the formation of the wiring layer 61 includes the formation of a seed layer covering the insulating layer 41 and the vias 42b by sputtering, the formation of a mask at predetermined positions on an upper surface of the seed layer, the formation of a metal layer by electrolytic plating using the seed layer as an electrode, the removal of the mask, and the removal of the exposed seed layer by etching.

Figure 5A:
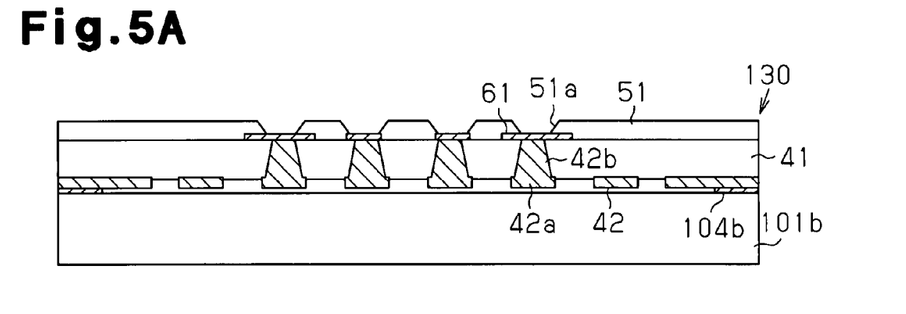

Then, referring to FIG. 5A, a liquid resist is applied to cover the insulating layer 41 and the wiring layer 61, and the liquid resist is cured to form the insulating layer 51. Via holes 51a are then formed by, for example, laser processing at predetermined positions in the insulating layer 51.

Figure 5B:
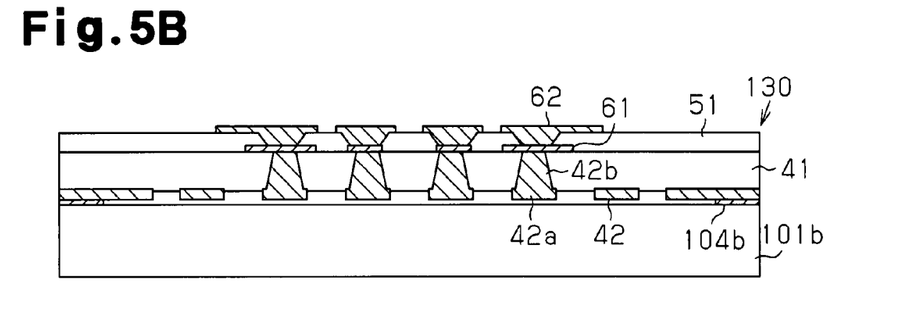

Referring to FIG. 5B, the wiring layer 62 is formed through, for example, a semi-additive process. Then, referring to FIG. 5C, a liquid resist is applied to cover the insulating layer 51 and the wiring layer 62, and the liquid resist is cured to form the insulating layer 52. Via holes 52a are formed by, for example, laser processing at predetermined positions in the insulating layer 52.

Figure 5C:
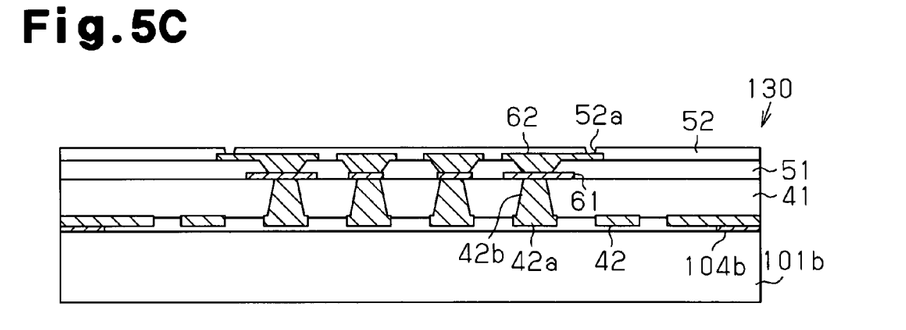
Figure 5D:
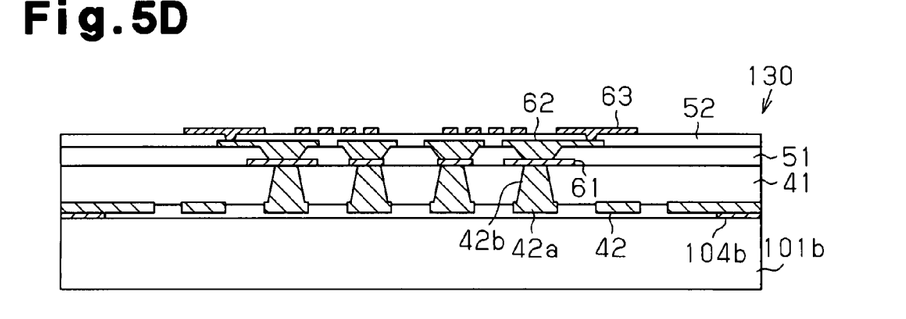
Figure 6A:
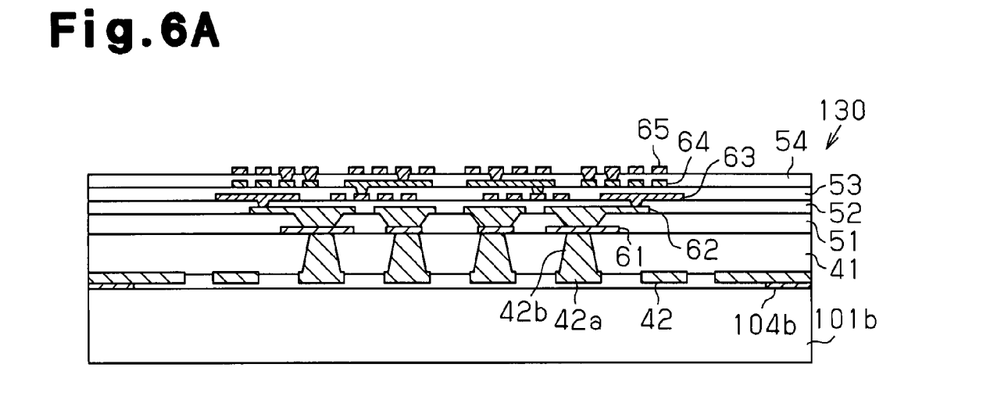

Referring to FIG. 5D, the wiring layer 63 is formed through, for example, a semi-additive process. Steps similar to the steps illustrated in FIGS. 5C and 5D are then repeated to form the insulating layers 53 and 54 and the wiring layers 64 and 65, as illustrated in FIG. 6A.

Figure 6B:
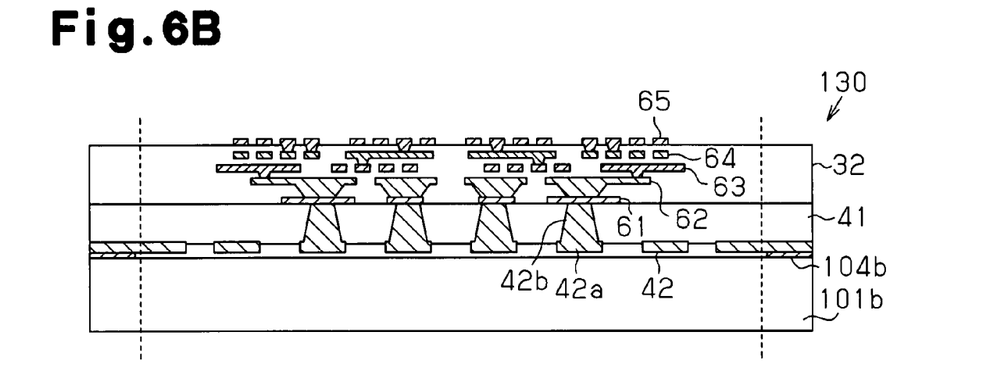
Figure 6C:
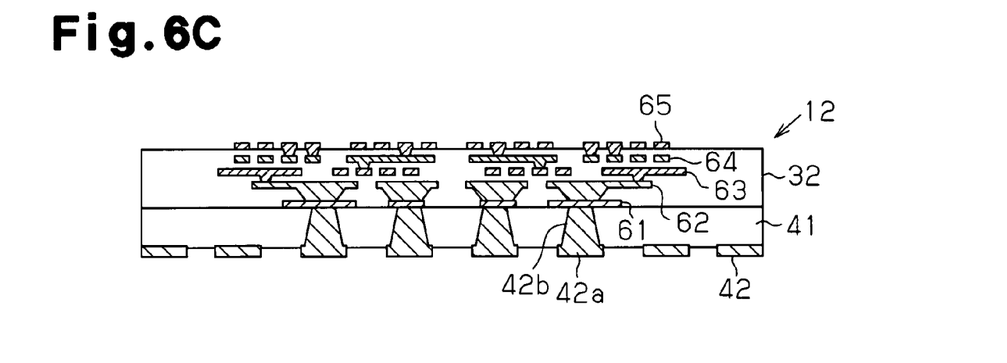

The rigid structure 130 is then cut with, for example, a router where broken lines are illustrated in FIG. 6B in correspondence with the adhesive layer 104b to separate the interposer 12 illustrated in FIG. 6C from the support body 101b. This completes the interposer 12. The insulating layers 51 to 54 are not illustrated in FIGS. 6A and 6B. The cutting position of the rigid structure 130 illustrated in FIG. 6B is set in accordance with the size of the interposer 12 and is set slightly toward the inner side from the inner edge of the adhesive layer 104b. The cutting position may be changed as long as the interposer 12 can be separated from the support body 101b. For example, the center of a router bit may be moved along the inner edge of the adhesive layer 104b to cut the rigid structure 130. The interposer 12 is an examples of a wiring substrate.

The present embodiment has the advantages described below.

(1) The interposer 12 connecting the package substrate 11 and the semiconductor element 13 includes the core substrate 41 and the wiring portion 32. The material of the core substrate 41 and the material of the plurality of insulating layers 51 to 54 in the wiring portion 32 is, for example, an organic resin. The core substrate (insulating layer 107) is adhered to the support body 101a to form the wiring layer 42, and the core substrate 41 is adhered to the support body 101b with the wiring layer 42 facing the support body 101b to form the wiring layers 61 to 65. Accordingly, the wiring layers 42 and 61 to 65 are formed on the two surfaces of the core substrate 41. By fixing the core substrate 41 to the support bodies 101a and 101b, the thickness of the core substrate 41 may be decreased. This allows for the interposer 12 that is manufactured to be thin and thereby be applicable to the semiconductor element 13 that has a narrow pitch.

(2) The wiring layers 42 and 61 to 65 are formed through a semi-additive process. Thus, the wiring layers 42 and 61 to 65 include fine wiring patterns that are easily formed. This allows the mounting pads for the semiconductor element 13 to be formed with a narrow pitch.

(3) The material of the core substrate 41 and the material of the insulating layers 51 to 54 in the wiring portion 32 are, for example, organic resin and do not contain a reinforcement material such as a glass cloth or the like. The interposer 12 has the suitable flexibility even after the curing of the resin of the core substrate 41 and the resin of the wiring portion 32. Due to the flexibility, the interposer 12 is bent in accordance with the deformation or the situation of the connected semiconductor element 13 and package substrate 11. Since the interposer 12 bends in accordance with the warping of the semiconductor element 13, for example, the semiconductor element 13 and the interposer 12 may be connected to the bumps 66. Further, connection failures of the semiconductor element 13 and the interposer 12 may be reduced or suppressed.

(4) The formation of the wiring layers 62 to 65 includes forming the via holes (FIGS. 5A and 5B illustrate the via holes 51a and 52a formed in the insulating layers 51, 52) by emitting a laser beam to the insulating layers 51 to 54. This allows for the aspect ratio of each via hole to be relatively low (e.g., one). As a result, the via holes are sufficiently filled with plating metal, the vias and the wiring patterns of the wiring layers 62 to 65 are simultaneously formed, and the manufacturing process is shortened.

(5) Generally, the adhesiveness of the wiring layer is relatively low in a silicon interposer. In the present embodiment, the material of the core substrate 41 and the material of the plurality of insulating layers 51 to 54 included in the wiring portion 32 are, for example, organic resin. Thus, the adhesiveness of the core substrate 41 and the wiring layer 42 and the adhesiveness of the insulating layers 51 to 54 and the wiring layers 61 to 65 are relatively high. This reduces or suppresses delamination between the core substrate 41 and the wiring layer 42 and between the insulating layers 51 to 54 and the wiring layers 61 to 65.

(6) The material of the core substrate 41 and the insulating layers 51 to 54 in the wiring portion 32 is, for example, an organic resin, and the via holes are easily formed by emitting a laser beam. This lowers the manufacturing cost of the interposer 12 as compared with a silicon interposer.

(7) The material of the core substrate 41 and the insulating layers 51 to 54 in the wiring portion 32 is, for example, an organic resin and do not contain a reinforcement material such as glass cloth and the like. Accordingly, the core substrate 41 and the insulating layers 51 to 54 easily bend. The manufacturing method of the present embodiment thus uses the support bodies 101a and 101b to ensure the mechanical strength necessary for the manufacturing process. As a result, the interposer 12 is easily manufactured (includes conveying and processing of rigid structure).

(7) The laminated plate 105 is adhered to the support body 101a by the adhesive layer 104a formed along the edge of the support body 101a. The multilayer structure 120 including the metal layer 106, the insulating layer 41, and the first wiring layer 42 is obtained by cutting the support body 101a and the laminated plate 105 at a predetermined location. Accordingly, the central portion of the laminated plate 105 that forms the multilayer structure 120 after cutting the rigid structure 110 is not adhered to the support body 101a. Thus, the multilayer structure 120 is easily separated from the support body 101a. In the same manner, the adhesive layer is formed along the periphery of the support body 101b, and the multilayer structure 120 is adhered to the support body 101b. This allows for the interposer 12 formed by the multilayer structure 120 to be easily separated from the support body 101b.

It should be apparent to those skilled in the art that the present invention may be embodied in many other specific forms without departing from the spirit or scope of the invention. Particularly, it should be understood that the present invention may be embodied in the following forms.

The core substrate 41 may be changed. For example, a resin material mixed with a filler such as silica and the like may be used as the material of the core substrate 41. The flexibility of the core substrate 41 may be adjusted by the filler. Instead of silica, an inorganic compound such as titanium oxide, aluminum oxide, aluminum nitride, silicon carbide, calcium titanate, zeolite, and the like, or an organic compound may be used as the filler.

Figure 7:
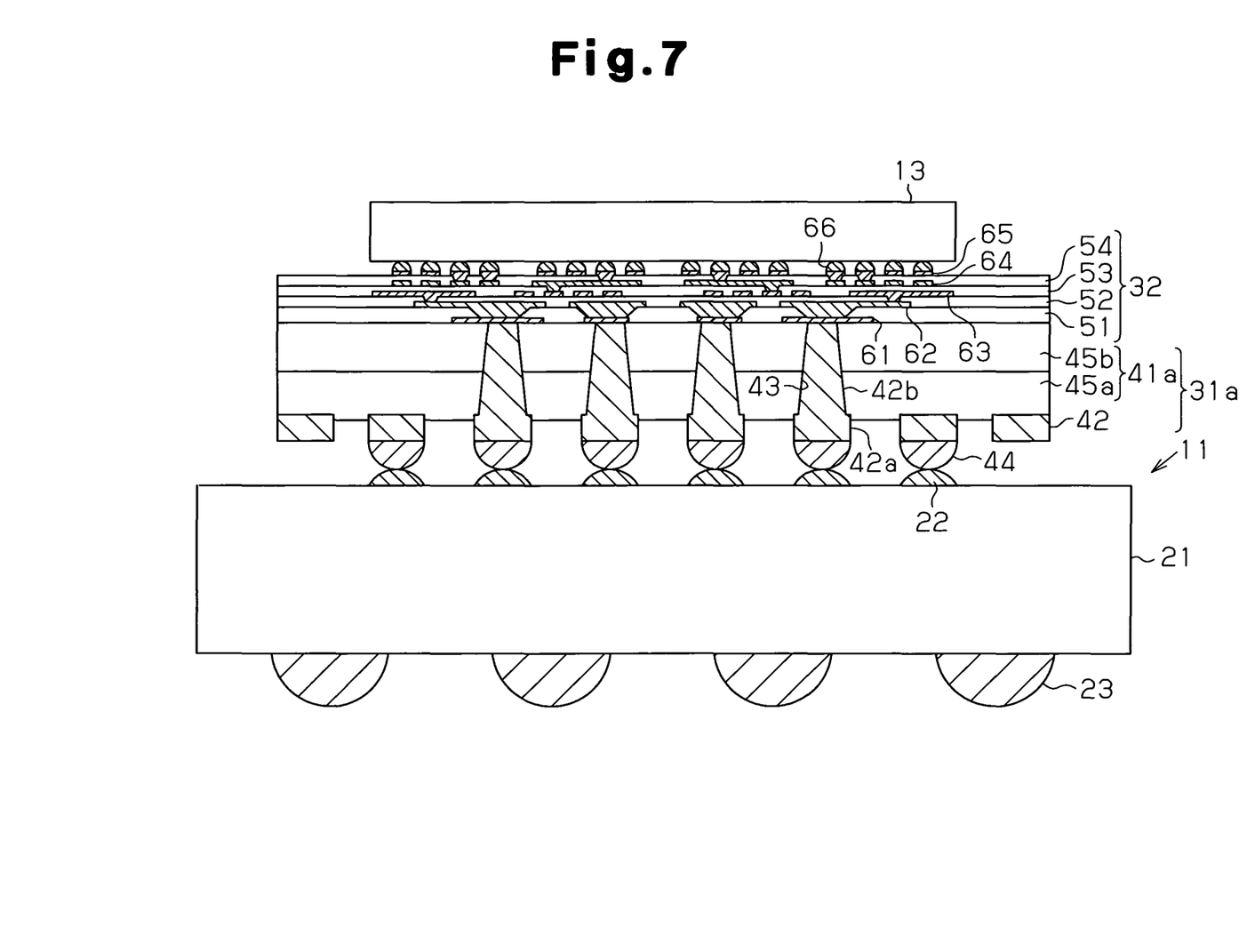
FIG. 7 is a schematic cross-sectional view illustrating a further example of a semiconductor package.

The core substrate 41 may be a body of laminated layers. The flexibility of the core substrate 41 may be adjusted in accordance with the number of layers, the thickness of each layer, the composition of each layer, and the like. In the example of FIG. 7, a core substrate 41a of a core portion 31a includes a first insulating layer 45a and a second insulating layer 45b. The insulating layers 45a and 45b may be formed from the same material or from different materials. One or both of the insulating layers 45a and 45b may be resin layers containing a filler. In another example, the insulating layers 45a and 45b are resin layers containing a filler. However, the type or percentage of the filler may be different.

The semiconductor package 10 may include semiconductor elements mounted on the same interposer 12.

An underfill resin may be filled and cured between the semiconductor element 13 and the interposer 12 and between the interposer 12 and the package substrate 11.

The semiconductor element 13 and the interposer 12 may be covered or encapsulated by, for example, a resin.

The disclosure further encompasses various example(s) described below:

[Clause 1] A wiring substrate comprising:
a first surface including a plurality of first pads arranged at a first pitch;
a second surface opposite to the first surface, wherein the second surface includes a plurality of second pads arranged at a second pitch that differs from the first pitch;
a core substrate including the first surface;
a wiring portion arranged on the core substrate, wherein the wiring portion includes the second surface, a plurality of insulating layers, and a plurality of wiring layers connecting the first pads and the second pads, wherein
the core substrate is a flexible organic resin substrate, and
each of the insulating layers of the wiring portion is a flexible organic resin insulating layer.

[Clause 2] The wiring substrate according to clause 2, wherein
the core substrate is a flexible organic resin substrate free from a glass cloth, and each of the insulative layers of the wiring portion is a flexible organic resin layer free from a glass cloth.

[Clause 3] The wiring substrate according to clause 1, wherein the first pitch is relatively wide, and the second pitch is relatively narrow.

[Clause 4] A semiconductor package comprising:
a semiconductor element;
a package substrate; and
the wiring substrate according to clause 1 connecting the semiconductor element and the package substrate.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

The invention claimed is:

1. A method of manufacturing a wiring substrate, the method comprising:
   preparing a laminated plate in which a metal layer and an insulating layer are laminated;
   adhering the laminated plate to a first support body with the metal layer facing the first support body;
   forming a first wiring layer including vias that extend through the insulating layer and first pads exposed from a first surface of the insulating layer;
   separating from the first support body a multilayer structure including the metal layer, the insulating layer, and the first wiring layer;
   adhering the multilayer structure to a second support body with the first wiring layer facing the second support body;
   removing the metal layer with the second support body supporting the first wiring layer and the insulating layer;
   forming a plurality of second wiring layers including second pads that are connected to the vias and exposed from a second surface of the insulating layer that is opposite to the first surface; and
   separating the insulating layer, the first wiring layer, and the plurality of second wiring layers from the second support body to obtain the wiring substrate.

2. The method according to claim 1, wherein the first wiring layer and the plurality of second wiring layers are formed through a semi-additive process.

3. The method according to claim 1, wherein the insulating layer is an organic resin layer.

4. The method according to claim 1, wherein the insulating layer includes a plurality of insulating layers.

5. The method according to claim 1, wherein the forming a first wiring layer includes forming the vias and the first pads in the insulating layer with the first support body supporting the laminated plate.

6. The method according to claim 1, wherein the metal layer is removed with the second support body supporting the multilayer structure.

7. The method according to claim 1, wherein the plurality of second wiring layers are formed with the second support body supporting the multilayer structure.

8. A method of manufacturing a wiring substrate, the method comprising:
   preparing a laminated plate in which a metal layer and an insulating layer are laminated;
   adhering the laminated plate to a first support body with the metal layer facing the first support body;
   forming a first wiring layer including vias that extend through the insulating layer and first pads exposed from a first surface of the insulating layer;
   separating from the first support body a multilayer structure including the metal layer, the insulating layer, and the first wiring layer;
   adhering the multilayer structure to a second support body with the first wiring layer facing the second support body;
   removing the metal layer;
   forming a plurality of second wiring layers including second pads that are connected to the vias and exposed from a second surface of the insulating layer that is opposite to the first surface; and
   separating the insulating layer, the first wiring layer, and the plurality of second wiring layers from the second support body to obtain the wiring substrate,
   wherein the adhering the laminated plate to the first support body includes
   forming a first adhesive layer on an edge of one surface of the first support body facing the metal layer, and
   adhering the laminated plate to the first support body through the first adhesive layer.

9. A method of manufacturing a wiring substrate, the method comprising:
   preparing a laminated plate in which a metal layer and an insulating layer are laminated;
   adhering the laminated plate to a first support body with the metal layer facing the first support body;
   forming a first wiring layer including vias that extend through the insulating layer and first pads exposed from a first surface of the insulating layer;
   separating from the first support body a multilayer structure including the metal layer, the insulating layer, and the first wiring layer;
   adhering the multilayer structure to a second support body with the first wiring layer facing the second support body;
   removing the metal layer;
   forming a plurality of second wiring layers including second pads that are connected to the vias and exposed from a second surface of the insulating layer that is opposite to the first surface; and
   separating the insulating layer, the first wiring layer, and the plurality of second wiring layers from the second support body to obtain the wiring substrate, wherein the adhering the multilayer structure to the second support body includes
   forming a second adhesive layer at an edge of one surface of the second support body facing the first wiring layer, and
   adhering the multilayer structure to the second support body through the second adhesive layer.

* * * * *